United States Patent
Lee et al.

(10) Patent No.: US 8,105,647 B2
(45) Date of Patent: Jan. 31, 2012

(54) METHOD OF FORMING OXIDE FILM AND OXIDE DEPOSITION APPARATUS

(75) Inventors: Jin-Ho Lee, Seoul (KR); Young-Ki Han, Seoul (KR); Jae-Chan Kwak, Gyeonggi-do (KR)

(73) Assignee: Jusung Engineering Co., Ltd., Gwangju-si, Gyeonggi-do ( * ) Notice: Subject to any disclaimer, the term of this patent is extended or adjusted under 35 U.S.C. 154(b) by 437 days.

(21) Appl. No.: 11/697,652

(22) Filed: Apr. 6, 2007

(65) Prior Publication Data
US 2007/0234957 A1    Oct. 11, 2007

(30) Foreign Application Priority Data
Apr. 6, 2006   (KR) .................. 10-2006-0031292

(51) Int. Cl.
*C23C 16/00*   (2006.01)

(52) U.S. Cl. ........... 427/248.1; 427/255.23; 427/255.18; 427/249.15

(58) Field of Classification Search .................. None
See application file for complete search history.

(56) References Cited

U.S. PATENT DOCUMENTS

| | | | |
|---|---|---|---|
| 6,258,637 B1 * | 7/2001 | Wilk et al. | 438/151 |
| 6,769,629 B2 * | 8/2004 | Hwang et al. | 239/224 |
| 6,872,421 B2 * | 3/2005 | Hwang et al. | 427/248.1 |
| 6,919,597 B2 * | 7/2005 | Cho et al. | 257/310 |
| 2002/0014663 A1 * | 2/2002 | Iwamatsu et al. | 257/349 |
| 2004/0082171 A1 * | 4/2004 | Shin et al. | 438/689 |
| 2005/0084610 A1 * | 4/2005 | Selitser | 427/248.1 |
| 2005/0181633 A1 * | 8/2005 | Hochberg et al. | 438/787 |

OTHER PUBLICATIONS

Werbowy et al. "Impulse plasma deposition of aluminum oxide layers for Al2O3/Si, SiC, GaN systems" 2003 Surface and Coating Technology 174-175.*

* cited by examiner

*Primary Examiner* — Timothy Meeks
*Assistant Examiner* — Mandy Louie
(74) *Attorney, Agent, or Firm* — Portland IP Law LLC

(57) ABSTRACT

The present invention relates to an oxide film forming method and an oxide deposition apparatus, which make it possible to form an oxide film at a low temperature of 350° C. or less by respectively supplying a silicon-containing gas including at least one of $SiH_4$, $Si_2H_6$, $Si_3H_8$, TEOS, DCS, HCD and TSA, a purge gas, and a reaction gas including at least one of $O_2$, $N_2O$, $O_3$, $H_2O$ and $H_2O_2$ into a reaction space continuously and simultaneously while rotating gas injector, and to form an oxide film with a uniform thickness along a step of a lower structure with a micro-pattern since step coverage is improved due to an atomic layer deposition process.

10 Claims, 8 Drawing Sheets

//  METHOD OF FORMING OXIDE FILM AND
OXIDE DEPOSITION APPARATUS

This application claims priority to Korean Patent application No. 10-2006-0031292, filed on Apr. 6, 2006, and all the benefits accruing therefrom under 35 U.S.C. 119, the contents of which are herein incorporated by reference in its entirety.

BACKGROUND OF THE INVENTION

1. Field of the Invention

The present invention relates to a method of forming an oxide film and an oxide deposition apparatus, and more particularly, to a method of forming a silicon oxide film through an atomic layer deposition (ALD) process using any one of $SiH_4$, $Si_2H_6$, $Si_3H_8$, tetraethylorthosilicate (TEOS), dichlorosilane (DCS), hexachlorosilane (HCD) and trisilylamine (TSA), and an oxide deposition apparatus.

2. Description of the Related Art

In recent, since the line width of a semiconductor device is micronized (into 100 nm or less), a semiconductor substrate is enlarged, a deposited thin film is micronized and multi-layered, the uniform thickness and high step coverage of an oxide film on a large area have been required.

However, conventional oxide film manufacturing methods could not satisfy such requirements. That is, a conventional chemical vapor deposition (CVD) method includes placing a substrate, on which an oxide film will be formed, in a predetermined process chamber, and exhausting impurities, which are introduced in a process of loading the substrate, from the chamber. Then, a silicon-containing gas and a reaction gas are simultaneously injected into the chamber in a state where the process chamber is maintained at a temperature of 500 to 800° C., to thereby grow a silicon oxide film on the substrate through the reaction of the silicon-containing gas with the reaction gas. Accordingly, the deposition rate of oxide film can be improved through the conventional CVD method. However, empty spaces such as voids are generated between patterns, and an oxide film is not formed on sidewall surfaces of the patterns since uniform thickness or high step coverage of the oxide film can not be satisfied.

SUMMARY OF THE INVENTION

The present invention is to provide a method of forming an oxide film with uniform thickness and excellent step coverage through an atomic layer deposition (ALD) process using any one of $SiH_4$, $Si_2H_6$, $Si_3H_8$, tetraethylorthosilicate (TEOS), dichlorosilane (DCS), hexachlorosilane (HCD) and trisilylamine (TSA) as a source gas, and an oxide deposition apparatus.

According to an aspect of the present invention, there is provided a method of forming an oxide film on substrates, comprising: placing a plurality of substrates on a substrate mounting unit in a reaction space; and supplying a process gas onto the substrates through a gas injector with a plurality of injection parts, wherein the step of supplying a process gas includes: supplying a silicon-containing gas comprising at least one of $SiH_4$, $Si_2H_6$, $Si_3H_8$, TEOS, DCS, HCD and TSA through the first injection part of the gas injector; supplying a purge gas through the second injection part of the gas injector; supplying a reaction gas comprising at least one of $O_2$, $N_2O$, $O_3$, $H_2O$ and $H_2O_2$ through the third injection part of the gas injector; supplying a purge gas through the fourth injection part of the gas injector; and allowing the first to fourth injection parts to pass the substrates sequentially.

The respective gases may be continuously supplied to the first to fourth injection parts. The first to fourth injection parts may sequentially pass a region above the substrates, which is repeatedly performed plural times.

The gas injector may be rotated relatively to the substrate mounting unit.

A time for the fourth injection part to arrives after the third injection part passes may be longer than a time for the second injection part arrives after the first injection part passes.

Before or after supplying the process gas, the method may further comprise: supplying a silicon-containing gas comprising at least one of $SiH_4$, $Si_2H_6$, $Si_3H_8$, TEOS, DCS, HCD and TSA through the gas injector; purging the silicon-containing gas; supplying a reaction gas comprising at least one of $O_2$, $N_2O$, $O_3$, $H_2O$ and $H_2O_2$ through the gas injector; and purging the reaction gas.

The steps of supplying and purging the silicon-containing gas and supplying and purging the reaction gas may be repeatedly performed plural times.

The substrates may be maintained at a temperature range of 100 to 400° C. According to another aspect of the present invention, there is provided a method of forming an oxide film on substrates, comprising: placing a plurality of substrates on a substrate mounting unit in a reaction space; and independently supplying a silicon-containing gas comprising at least one of $SiH_4$, $Si_2H_6$, $Si_3H_8$, TEOS, DCS, HCD and TSA, a purge gas, and a reaction gas comprising at least one of $O_2$, $N_2O$, $O_3$, $H_2O$ and $H_2O_2$ into the reaction space through a gas injector, wherein the silicon-containing gas, the purge gas, and the reaction gas are sequentially supplied onto the substrates, and the respective gases are continuously supplied without stop during the step of supplying the process gases.

The substrates may be maintained to a temperature range of 100 to 400° C.

According to a further aspect of the present invention, there is provided a method of forming an oxide film using an oxide film forming apparatus, which includes a chamber having a predetermined reaction space and a substrate mounting unit provided therein, and a gas injector rotatably provided above the substrate mounting unit in the chamber to inject a plurality of gases, the method comprising: placing a plurality of substrates on the substrate mounting unit and rotating the gas injector; supplying a silicon-containing gas comprising at least one of $SiH_4$, $Si_2H_6$, $Si_3H_8$, TEOS, DCS, HCD and TSA onto the substrates to adsorb the silicon-containing gas onto surfaces of the substrates; injecting a purge gas onto the substrates to purge the silicon-containing gas that is not adsorbed onto the substrates; supplying a reaction gas comprising at least one of $O_2$, $N_2O$, $O_3$, $H_2O$ and $H_2O_2$ onto the substrates to form an oxide film by oxidizing the silicon-containing gas adsorbed onto the surfaces of the substrates; and injecting a purge gas onto the substrates to purge the reaction gas that is not reacted with the silicon-containing gas, wherein the silicon-containing gas, the purge gas, and the reaction gas are supplied continuously and simultaneously.

According to a still further aspect of the present invention, there is provided an oxide deposition apparatus, comprising: a substrate mounting unit for allowing a plurality of substrates placed thereon; a chamber having the substrate mounting unit provided therein and defining a predetermined reaction space therein; a gas injector rotatably formed in an upper part in the chamber to inject gases; a first injection part to inject a silicon-containing gas, second and fourth injection parts for injecting a purge gas, and a third injection part for injecting a reaction gas, the first to fourth injection parts being connected to the gas injector; and an injection part controller for independently controlling the first to fourth injection parts, wherein the second and fourth injection parts are provided between the first and third injection parts, and a distance between the first injection part and each of the second and fourth injection parts is shorter than a distance between the third injection part and each of the second and fourth injection parts.

BRIEF DESCRIPTION OF THE DRAWINGS

The above and other aspects, features and advantages of the present invention will become apparent from the following description of preferred embodiments given in conjunction with the accompanying drawings, in which.

DETAILED DESCRIPTION OF THE PREFERRED EMBODIMENT

Figure 1:
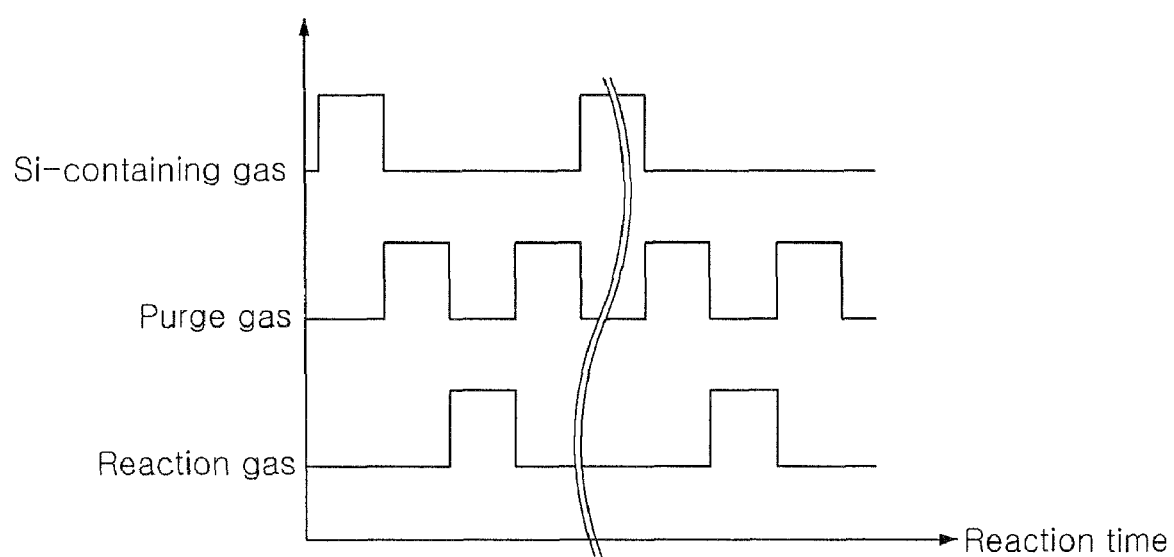
FIG. 1 is a process flowchart illustrating an oxide film forming method according to a first embodiment of the present invention.

Hereinafter, preferred embodiments of the present invention will be described in detail with reference to the accompanying drawings. However, the present invention is not limited to the embodiments disclosed below but may be implemented into different forms. These embodiments are provided only for illustrative purposes and for full understanding of the scope of the present invention by those skilled in the art. Throughout the drawings, like reference numerals are used to designate like elements.

Figure 2:
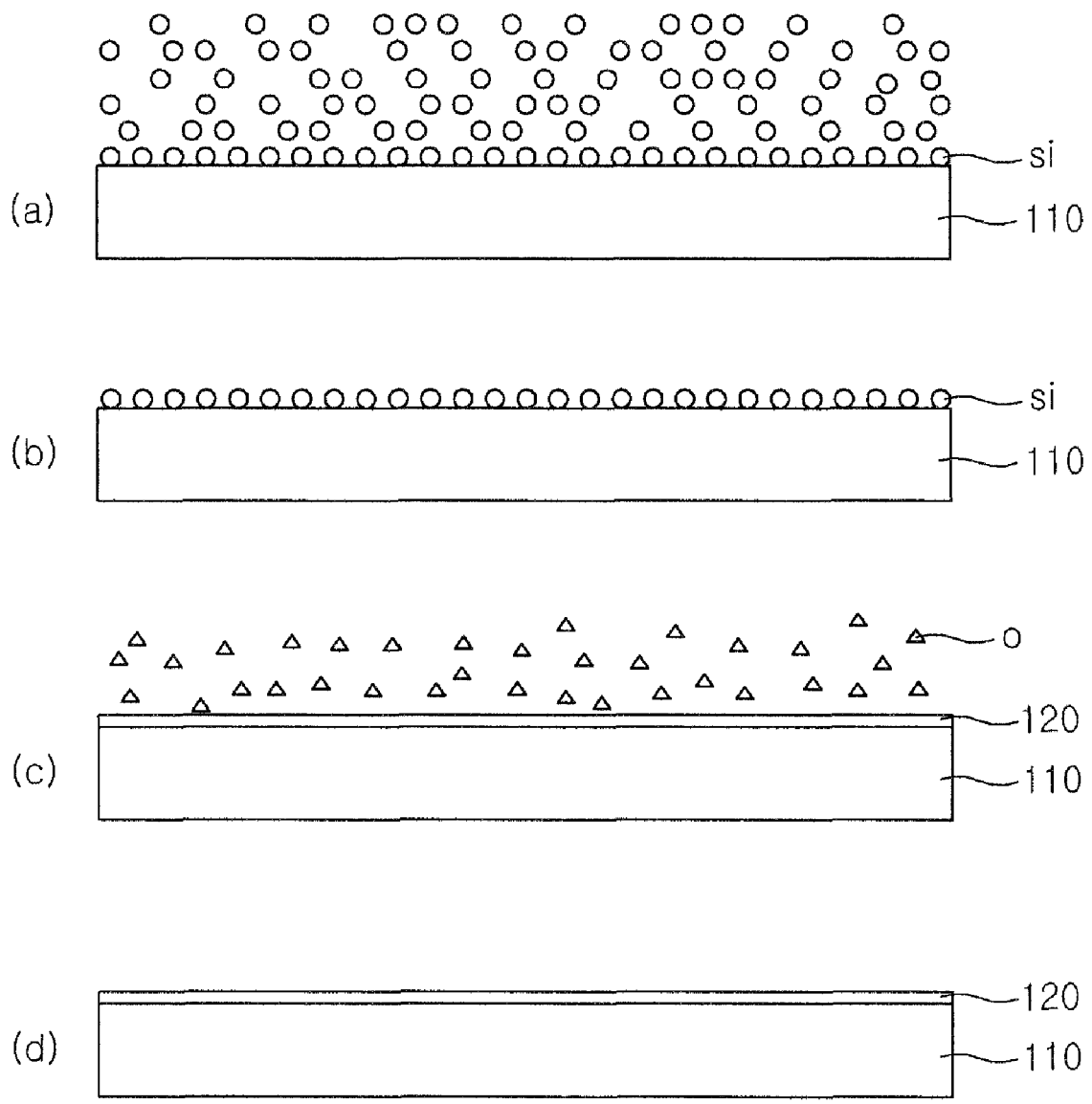
FIG. 2 is a schematic cross sectional view illustrating the oxide film forming method according to the first embodiment.
Figure 3:
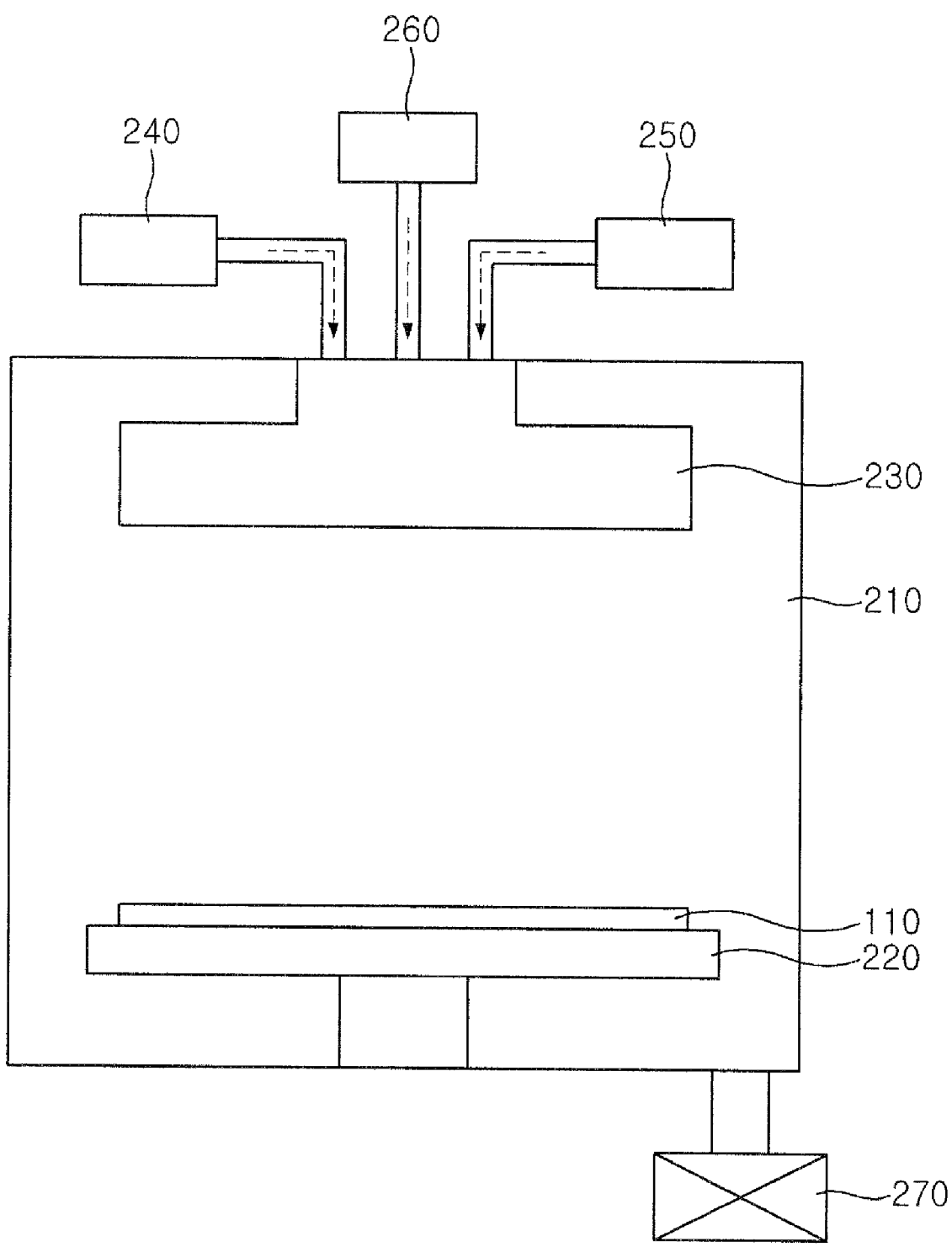
FIG. 3 is a cross sectional view of an oxide deposition apparatus according to the first embodiment.

FIG. 1 is a process flowchart illustrating an oxide film forming method according to a first embodiment of the present invention, FIG. 2 is a schematic cross sectional view illustrating the oxide film forming method according to the first embodiment, and FIG. 3 is a cross sectional view of an oxide deposition apparatus according to the first embodiment.

Referring to FIGS. 1 to 3, a semiconductor substrate 110 is placed on a substrate mounting unit 220 in a chamber 210. A silicon oxide film with a desired thickness is formed by repeating a process as one cycle plural times, wherein the process includes supplying a silicon-containing gas, which includes at least one of $SiH_4$, $Si_2H_6$, $Si_3H_8$, tetraethylorthosilicate (TEOS), dichlorosilane (DCS), hexachlorosilane (HCD) and trisilylamine (TSA), through a gas supplying unit 230, purging the silicon-containing gas, supplying a reaction gas, which includes at least one of $O_2$, $N_2O$, $O_3$, $H_2O$ and $H_2O_2$, and purging the reaction gas, thereby forming a single atomic layered oxide film 120.

First, an apparatus for performing the aforementioned process will be briefly described as follows.

As shown in FIG. 3, the apparatus includes the chamber 210 having a predetermined reaction space, the substrate mounting unit 220, which is provided in the reaction space of the chamber 210, and on which the substrate 110 is placed, the gas supplying unit 230 for supplying the substrate 110 with the silicon-containing gas, which includes at least one of $SiH_4$, $Si_2H_6$, $Si_3H_8$, TEOS, DCS, HCD and TSA, a purge gas, and the reaction gas, which includes at least one of $O_2$, $N_2O$, $O_3$, $H_2O$ and $H_2O_2$, and first to third raw material storage units 240, 250 and 260 for storing the silicon-containing gas, the reaction gas and the purge gas, respectively. An inert gas, preferably Ar in this embodiment, is used as the purge gas.

The apparatus further includes a discharge unit 270 for exhausting the inside of the chamber 210.

In addition, the apparatus is not limited thereto, but may further include a vacuum pump for evacuating the inside of the chamber 210, a heating unit for heating the substrate within the chamber 210, and a cooling unit for cooling the substrate although not shown in the figures. Further, there may be further provided a plasma generator for generating plasma installed within the chamber 210 to activate the gas supplied into the chamber 210. The apparatus is not limited thereto, but may further include a remote plasma unit for supplying the chamber 210 with the reaction gas activated through the gas supplying unit 230.

An opening/closing portion (not shown) is formed at one side of the chamber 210 to load or unload the substrate 110. The substrate mounting unit 220 can be divided into a plurality of members to hold the substrate by vacuum or to fix the substrate using electromagnetic properties. Additionally, the substrate mounting unit 220 may include a lifting member (not shown) to move up and down, or lift pins (not shown) provided therein so that the lift pins are used for loading or unloading the substrate 110.

The gas supplying unit 230 may be manufactured in the form of a shower head or an injector. Furthermore, the gas supplying unit 230 may be manufactured with a plurality of members capable of injecting different gases into the chamber 210 or with a single member capable of injecting a single gas into the chamber 210.

Hereinafter, the oxide film forming method according to this embodiment using the aforementioned deposition apparatus will be described based on the process flowchart of FIG. 1 and the schematic cross sectional view of FIG. 2.

The substrate 110 is placed on the substrate mounting unit 220 in the chamber 210, and then, the inside of the chamber 210 is maintained at a range of 100 to 350° C. and at a range of 10-6 to 10-2 torr.

Thereafter, the silicon-containing gas, which include at least one of $SiH_4$, $Si_2H_6$, $Si_3H_8$, TEOS, DCS, HCD and TSA, is supplied into the chamber 210 through the gas supplying unit 230. Thus, the silicon-containing gas is adsorbed onto the surface of the substrate 110 as shown in FIG. 2(a). Then, the supply of the silicon-containing gas is cut off, a purge gas is supplied into the chamber 210. Accordingly, the silicon-containing gas remained in the chamber 210 is discharged to the outside as shown in FIG. 2(b). Then, the supply of the purge gas is cut off, and the reaction gas is supplied into the chamber 210. Accordingly, the silicon-containing gas adsorbed onto the surface of the substrate 110 reacts with the reaction gas to form an oxide film 120 on the surface of the substrate 110 as shown in FIG. 2(c). Thereafter, a purge gas is supplied into the chamber after cutting off the supply of the reaction gas. Accordingly, an oxide film is formed in an atomic layer unit on the surface of the substrate 110 after discharging the reaction gas to the outside as shown in FIG. 2(d). As described above, the oxide film with a desired thickness can be formed by repeating the process of supplying the silicon-containing gas, supplying the first purge gas, supplying the reaction gas and supplying the second purge gas as one cycle plural times.

In the foregoing process, plasma may be generated in the chamber 210 to increase the reactivity of the reaction gas according to the degree of oxidation during the supply of the reaction gas. At this time, inductively coupled plasma (ICP) or capacitively coupled plasma (CCP) is preferably applied into the chamber. Further, it is preferred that supply time of the reaction gas be 1.5 to 3 times longer than that of the silicon-containing gas in order to improve reactivity between the reaction gas and the silicon-containing gas adsorbed onto the surface of the substrate 110. Accordingly, oxidation is sufficiently performed, so that an oxide film of high quality can be formed.

As described above, the oxide film is formed using the silicon-containing gas, which includes at least one of $SiH_4$, $Si_2H_6$, $Si_3H_8$, TEOS, DCS, HCD and TSA, in this embodiment and deposited at a low temperature of 100 to 350° C. through an ALD process. Accordingly, it is possible to solve a conventional problem that the deposition of oxide at high temperature causes a thermal load to be applied to a lower structure under the oxide film. Furthermore, an oxide film with uniform thickness can be formed along the pattern step of the lower structure according to high step coverage of the ALD process.

As described above, according to the present invention, an oxide film can be formed by sequentially supplying process gases, i.e., the silicon-containing gas, the purge gas and the reaction gas. Furthermore, a batch type ALD apparatus in which two or more substrates are loaded can be used in order to improve the deposition rate of the oxide film, and a continuous ALD process of continuously supplying plural process gases can be implemented to form an oxide film. Hereinafter, a thin film depositing method for forming an oxide film through a continuous ALD process according to a second embodiment of the present invention will be described. The descriptions overlapping with those of the foregoing embodiment will be omitted, and technical constitutions to be described can be applied to the foregoing embodiment.

Figure 4:
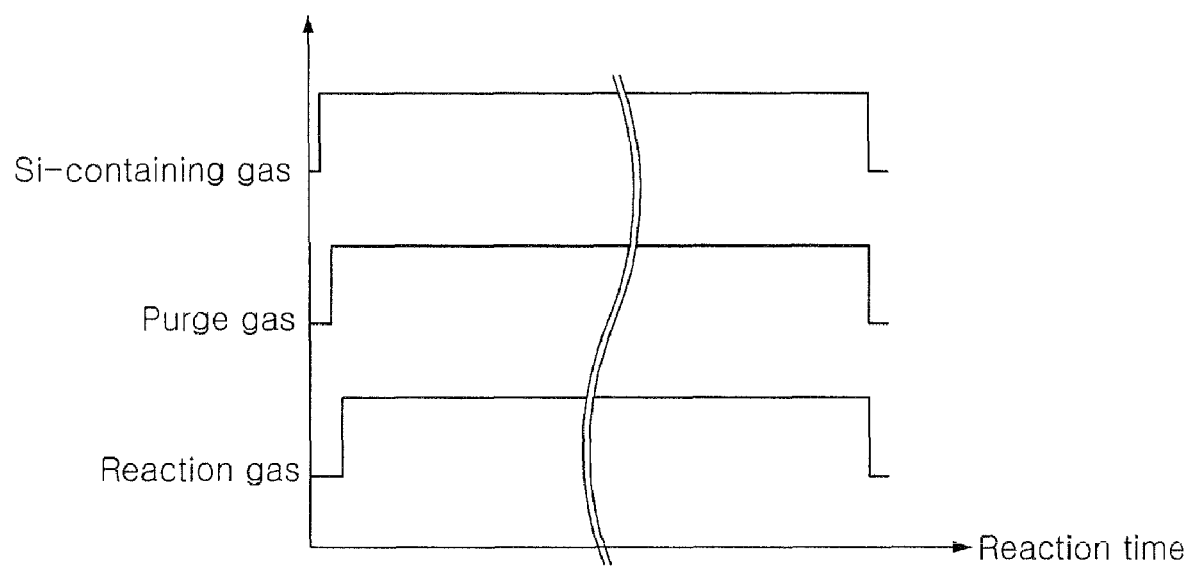
FIG. 4 is a process flowchart according to a second embodiment of the present invention.
Figure 5:
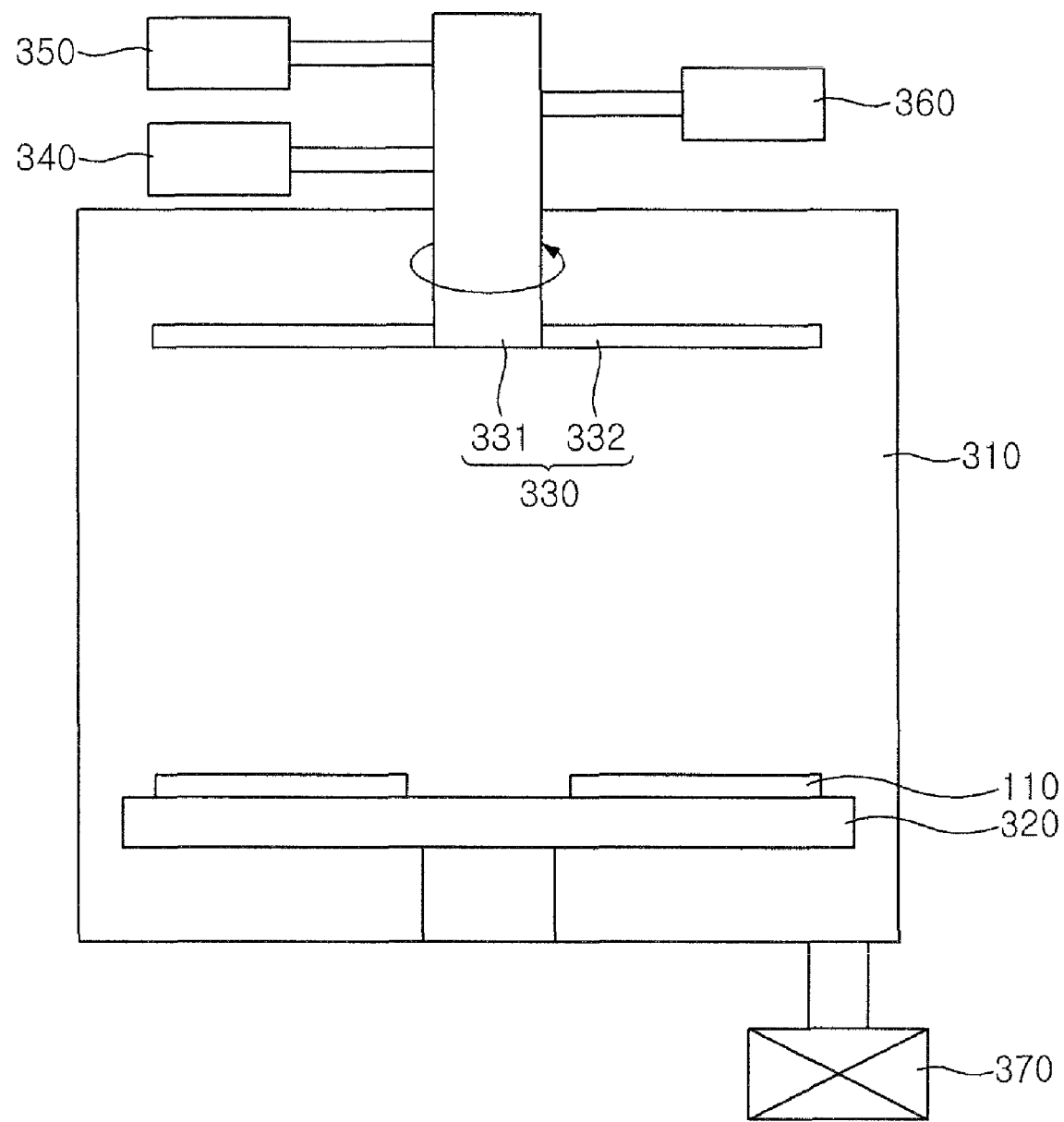
FIG. 5 is a cross sectional view of an oxide deposition apparatus according to the second embodiment.
Figure 6:
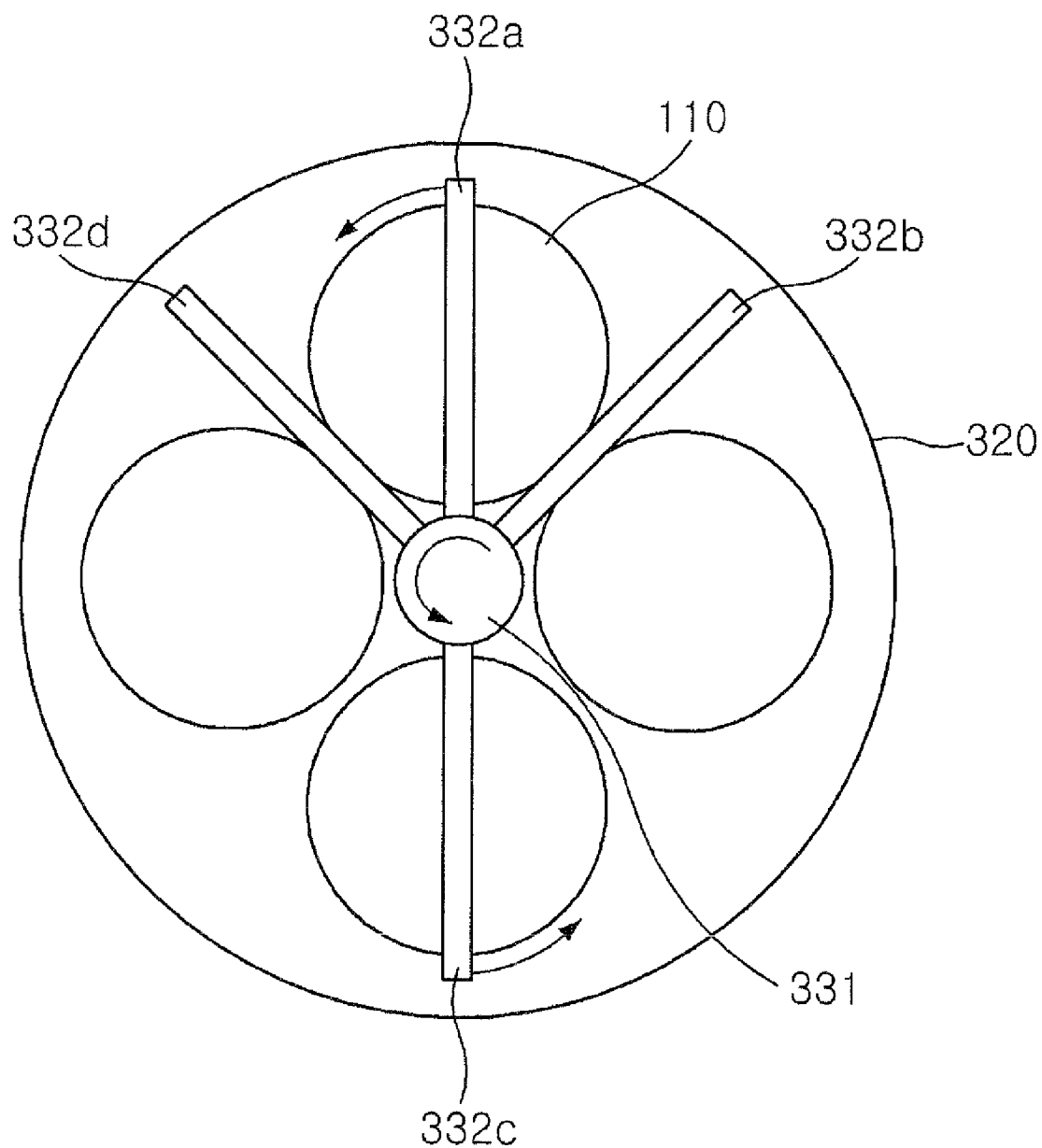
FIG. 6 is a schematic plan view of the oxide deposition apparatus according to the second embodiment.

FIG. 4 is a process flowchart according to a second embodiment of the present invention, FIG. 5 is a cross sectional view of an oxide deposition apparatus according to the second embodiment, and FIG. 6 is a schematic plan view of the oxide deposition apparatus according to the second embodiment.

Referring to FIGS. 4 and 5, an oxide film forming method according to this embodiment includes supplying a silicon-containing gas, which includes at least one of $SiH_4$, $Si_2H_6$, $Si_3H_8$, TEOS, DCS, HCD and TSA, a purge gas, and a reaction gas, which includes at least one of $O_2$, $N_2O$, $O_3$, $H_2O$ and $H_2O_2$, onto substrates 110 to form an oxide film with a desired thickness.

Referring to FIGS. 5 and 6, an ALD deposition apparatus for performing such a continuous ALD process will described below.

As described in FIG. 6, a deposition apparatus according to this embodiment comprises a chamber 310, a substrate mounting unit 320 on which a plurality of the substrates 110 are placed, a raw material injection unit 330, which has a gas injector 331 and a plurality of injection parts 332 (332a, 332b, 332c and 332d) connected to the gas injector 331 to respectively supply the silicon-containing gas, which includes at least one of $SiH_4$, $Si_2H_6$, $Si_3H_8$, TEOS, DCS, HCD and TSA, the purge gas, and the reaction gas, which includes at least one of $O_2$, $N_2O$, $O_3$, $H_2O$ and $H_2O_2$, into the gas injector 331, and first to third raw material storage units 340, 350 and 360 for respectively supplying the silicon-containing gas, the purge gas and the reaction gas into the raw material injection unit 330.

As shown in FIG. 6, four of the substrates 110 may be placed on the substrate mounting unit 320. To this end, the substrate mounting unit 320 may be rotated through a predetermined rotary member (not shown), move up and down, and include a plurality of lift pins.

Preferably, the raw material injection unit 330 includes the gas injector 331, wherein a portion of the gas injector 331 preferably protrudes to the outside of the chamber 310 to be rotated in contact with the predetermined rotary member (not shown). As shown in FIG. 6, the four injection parts 332a, 332b, 332c and 332d are formed in the gas injector 331 to extend to the inside of the chamber 310 to respectively inject the silicon-containing gas, the purge gas, the reaction gas and the purge gas.

The first to third raw material storage units 340, 350 and 360 supply the silicon-containing gas, the purge gas, the reaction gas and the purge gas into the injection parts 332a, 332b, 332c and 332d through the gas injector 331.

Preferably, the four injection parts 332a, 332b, 332c and 332d are disposed at upper, lower, left and right sides with respect to the gas injector 330 in the drawing, respectively, into a general cross form as shown in FIG. 6. When sequentially disposing the first to fourth injection parts 332a, 332b, 332c and 332d clockwise from the upper side, in accordance with a process condition, the first injection part 332a disposed at the upper side may supply the silicon-containing gas continuously, the third injection part 332c disposed at the lower side may supply the reaction gas continuously, and the second and fourth injection parts 332b and 332d disposed at the left and right sides may supply the purge gas continuously.

At this time, in order to secure a reaction time capable of performing oxidation sufficiently by increasing a time for which the reaction gas is injected onto the substrates 110 as compared with a time for which the silicon-containing gas is injected onto the substrates 110, it is preferred that a distance between the first injection part 332a for supplying the silicon-containing gas and the second and fourth injection parts 332b and 332d be shorter than a distance between the third injection part 332c for supplying the reaction gas and the second and fourth injection parts 332b and 332d as shown in FIG. 6.

The oxide film forming method according to this embodiment using the aforementioned apparatus will be described.

The plurality of substrates 110 are loaded into the apparatus to be placed on the substrate mounting unit 320. An oxide film is formed through a continuous ALD process. At this time, in the continuous ALD process, the inside of the chamber 310 is evacuated and maintained at a temperature of a range between 100 and 400° C. Then, while the gas injector 331 of the raw material injection unit 330 is rotated, the silicon-containing gas, which includes at least one of $SiH_4$, $Si_2H_6$, $Si_3H_8$, TEOS, DCS, HCD and TSA, is continuously injected through the first injection part 332a, the purge gas is continuously injected through the second and fourth injection parts 332b and 332d, and the reaction gas, which includes at least one of $O_2$, $N_2O$, $O_3$, $H_2O$ and $H_2O_2$, is continuously injected through the third injection part.

At this time, since the gas injector 331 is rotated counterclockwise as shown in FIG. 6, the first to fourth injection parts 332a, 332b, 332c and 332d connected to the gas injector 331 are also rotated counterclockwise. Therefore, while the first injection part for injecting the silicon-containing gas passes a region above the plurality of substrates 110, the silicon-containing gas, which includes at least one of $SiH_4$, $Si_2H_6$, $Si_3H_8$, TEOS, DCS, HCD and TSA, is adsorbed onto the surfaces of the substrates. Subsequently, while the second injection part 332b for injecting the purge gas passes the region above the plurality of substrates 110, the silicon-containing gas that is not adsorbed onto the substrates is purged. Continuously, while the third injection part 332c for injecting the reaction gas passes the region above the plurality of substrates 110, the silicon-containing gas adsorbed onto the surfaces of the substrates reacts with the reaction gas, which includes at least one of $O_2$, $N_2O$, $O_3$, $H_2O$ and $H_2O_2$, to form an oxide film. Thereafter, while the fourth injection part 332d for injecting the purge gas passes the region above the plurality of substrates 110, the reaction gas that does not react with the silicon-containing gas is purged. The foregoing process is performed for a determined time to form an oxide film with a desired thickness.

At this time, when injecting the reaction gas, additional plasma may be applied to activate the reaction gas.

Furthermore, according to the present invention, an oxide film can be formed by alternately performing the aforementioned oxide film forming methods according to the first and second embodiments. That is, the process of supplying the silicon-containing gas, the purge gas, the reaction gas and the purge gas is first performed as one cycle. Thereafter, the silicon-containing gas, the purge gas, the reaction gas and the purge gas are continuously supplied to form an oxide film. The process can also be performed vice versa. At this time, if the apparatus for the second embodiment is used, the same raw material should be injected from all of the injection parts during the cycle process.

Figure 7:
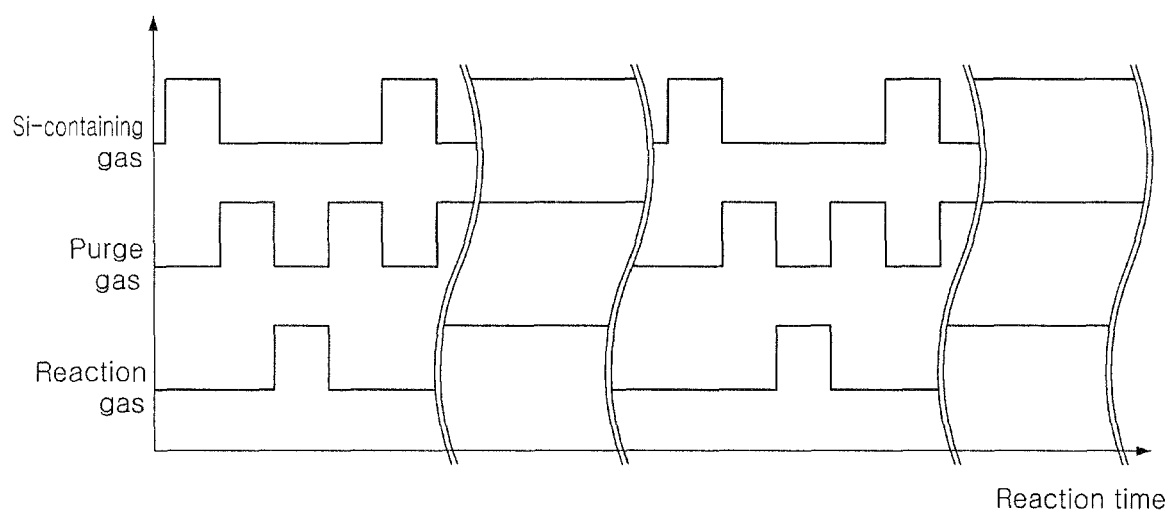
FIG. 7 is a process flowchart illustrating an oxide film forming method according to a modified embodiment of the present invention.

FIG. 7 is a process flowchart illustrating an oxide film forming method according to a modified embodiment of the present invention.

Referring to FIG. 7, the silicon-containing gas is adsorbed onto the surfaces of the substrates by supplying the silicon-containing gas from the first to fourth injection parts 332a, 332b, 332c and 332d. Subsequently, the purge gas is supplied to remove the silicon-containing gas that is not adsorbed onto the substrates. Then, the reaction gas is supplied to react with the silicon-containing gas adsorbed onto the surfaces of the substrates to form an oxide film. Thereafter, the purge gas is supplied to remove the reaction gas that does not react with the silicon-containing gas. The process of supplying the silicon-containing gas, purging the silicon-containing gas, supplying the reaction gas and purging the reaction gas is performed as one cycle at least once. That is, the oxide film is formed by performing a sequential ALD process through the sequential supply of the gases. Thereafter, the silicon-containing gas, the purge gas, the reaction gas and the purge gas are respectively supplied through the first to fourth injection parts 332a, 332b, 332c and 332d simultaneously and continuously to thereby form an oxide film on the substrates. That is, the oxide film is formed by performing a continuous ALD process through the continuous supply of the gases. Preferably, the sequential ALD process and the continuous ALD process are alternately performed at least once as illustrate in FIG. 7 to form an oxide film.

Furthermore, the present invention is not limited to a $SiO_2$ film of the aforementioned embodiments, but may be used to manufacture a variety of oxide thin films such as $Al_2O_3$, $TiO_2$, $ZrO_2$, $Nb_2O_5$, $Ta_2O_5$, $In_2O_3$ and MgO films. At this time, the foregoing oxide thin films can be easily changed only by exchanging the silicon-containing gas with a raw material for the oxide thin films.

Hereinafter, a method for manufacturing a semiconductor device to which the foregoing oxide film forming method is applied will be briefly described.

Figure 8:
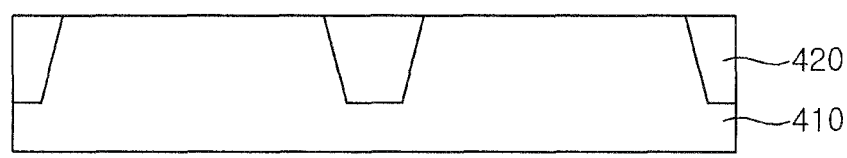
FIGS. 8 to 10 are cross sectional views illustrating a semiconductor device manufacturing method according to the present invention.
Figure 9:
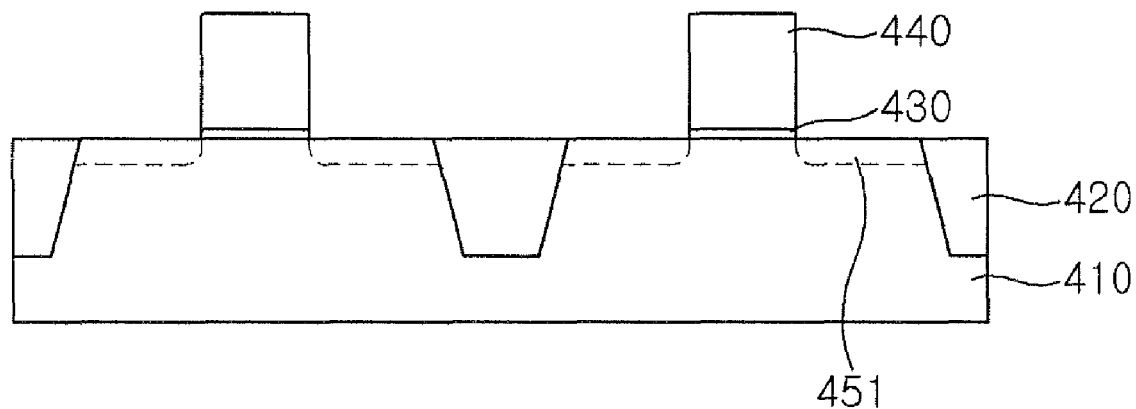
Figure 10:
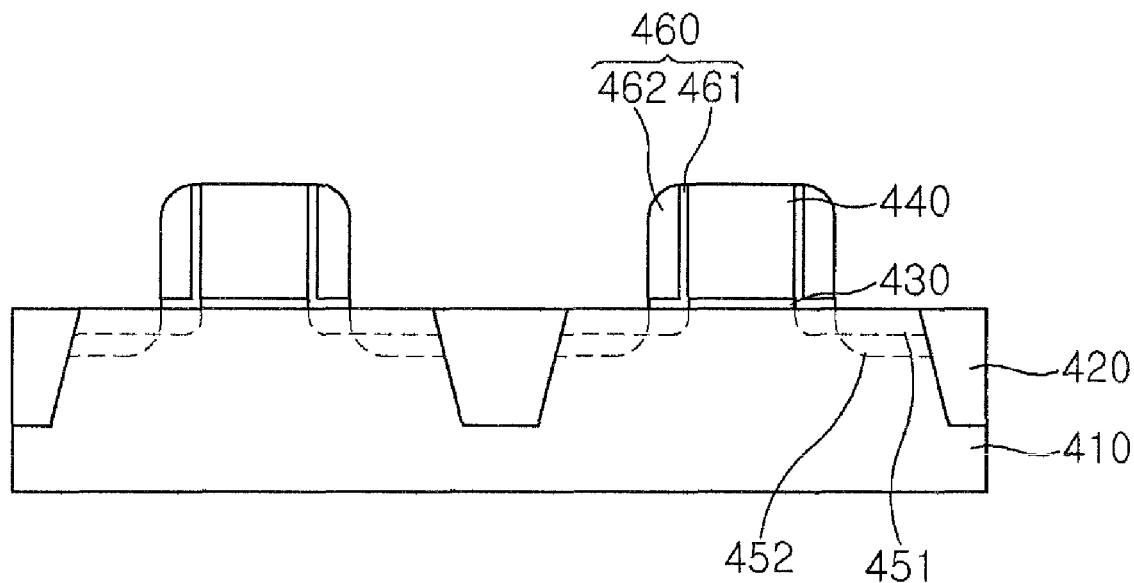

FIGS. 8 to 10 are cross sectional views illustrating a semiconductor device manufacturing method according to the present invention.

Referring to FIG. 8, device separation films 420 for separating devices from each other are formed on a semiconductor substrate 410. Preferably, the device separation films 420 are manufactured in an STI structure as shown in FIG. 8. The device separation film 420 is not limited thereto, but may be manufactured in various structures.

It is preferred that the device separation film 420 is formed by removing portions of the semiconductor substrate 410 corresponding to device separation regions to form trenches and filling them with an oxide film. At this time, the oxide film filled in the trenches is formed through the ALD process using the silicon-containing gas, which includes at least one of $SiH_4$, $Si_2H_6$, $Si_3H_8$, TEOS, DCS, HCD and TSA, according to the aforementioned embodiments.

Referring to FIG. 9, gate dielectric films 430 and gate electrodes 440 are formed on the semiconductor substrate 410 between the device separation films 420. In addition, low concentration doped regions may be formed by implanting ions into the semiconductor substrate 410 at both sides of each gate electrode 440. It is preferred that an oxide film to be the gate dielectric films is formed on the semiconductor substrate 410, a conductive film to be the gate electrodes is formed on the oxide film to be the gate dielectric films, and then the gate dielectric films 430 and the gate electrodes 440 are formed by patterning the oxide film and the conductive film. At this time, the oxide film to be the gate dielectric films may be formed through the ALD process using the silicon-containing gas according to the aforementioned embodiments.

Referring to FIG. 10, sidewall spacers 460 are formed on sidewalls of the gate electrodes 440. Then, high concentration doped regions 452 can be formed by implanting high concentration ions into the semiconductor substrate 410 at both sides of each gate electrode 440 with the spacers 460 formed.

The spacers 460 are preferably formed by forming oxide films 461 and nitride films 462 to be the spacers along the steps of the gate electrodes on the semiconductor substrate 410 on which the gate electrodes 440 are formed, and etching the oxide films 461 and the nitride films 462 to be the spacers for removing the oxide films 461 and the nitride films 462 in the regions except the sidewalls of the gate electrodes 440. At this time, the oxide films 461 are preferably formed through the ALD process of using the silicon-containing gas. Accordingly, the oxide film 461 with thin and uniform thickness can be formed along the step of the gate electrode 440 on a surface region thereof.

As described above, according to the present invention, an oxide film can be formed at a low temperature of 350° C. or less through an ALD process using a silicon-containing gas, which includes at least one of $SiH_4$, $Si_2H_6$, $Si_3H_8$, TEOS, DCS, HCD and TSA.

Furthermore, in the present invention, an oxide film with uniform thickness along the step of a lower structure with a micro-pattern can be formed since the step coverage is improved due to the ALD process.

Although the present invention have been illustrated and described in connection with the preferred embodiments and the accompanying drawings, it is not limited thereto but defined by the appended claims. Accordingly, it will be readily understood by those skilled in the art that various modifications and changes can be made thereto without departing from the spirit and scope of the present invention defined by the appended claims.

What is claimed is:

1. A method of forming an oxide film on substrates, comprising:

placing a plurality of substrates on a substrate mounting unit in a reaction space; and supplying a process gas onto the substrates through a gas injector with a plurality of injection parts that are adapted to rotate over the substrates, wherein supplying the process gas includes:

supplying a silicon-containing gas comprising at least one of $SiH_4$, $Si_2H_6$, $Si_3H_8$, TEOS, DCS, HCD and TSA through a first injection part of the gas injector;

supplying a purge gas through a second injection part of the gas injector;

supplying a reaction gas comprising at least one of $O_2$, $N_2O$, $O_3$, $H_2O$ and $H_2O_2$ through a third injection part of the gas injector;

supplying a purge gas through a fourth injection part of the gas injector; and allowing the first to fourth injection parts to pass the substrates sequentially, wherein the first to fourth injection parts are sequentially arranged in a clockwise direction, and wherein a first distance in a clockwise direction from the first injection part for supplying the silicon-containing gas to the second injection part, and a second distance in a counterclockwise direction from the first injection part to the fourth injection part are shorter than a third distance in a counterclockwise direction from the third injection part for supplying the reaction gas to the second injection part, and a fourth distance in a clockwise direction from the third injection part to the fourth injection part.

2. The method as claimed in claim 1, wherein the respective gases are continuously supplied to the first to fourth injection parts.

3. The method as claimed in claim 1, wherein the first to fourth injection parts sequentially pass a region above the substrates, which is repeatedly performed plural times.

4. The method as claimed in claim 1, wherein the gas injector is rotated relatively to the substrate mounting unit.

5. The method as claimed in claim 1, wherein before or after supplying the process gas, the method further comprises:

supplying a silicon-containing gas comprising at least one of $SiH_4$, $Si_2H_6$, $Si_3H_8$, TEOS, DCS, HCD and TSA through the gas injector;

purging the silicon-containing gas;

supplying a reaction gas comprising at least one of $O_2$, $N_2O$, $O_3$, $H_2O$ and $H_2O_2$ through the gas injector; and purging the reaction gas.

6. The method as claimed in claim 5, wherein the steps of supplying and purging the silicon-containing gas and supplying and purging the reaction gas are repeatedly performed plural times.

7. The method as claimed in claim 1, wherein the substrates are maintained at a temperature range of 100 to 400° C.

8. A method of forming an oxide film on substrates, comprising:

placing a plurality of substrates on a substrate mounting unit in a reaction space; and independently supplying a silicon-containing gas comprising at least one of $SiH_4$, $Si_2H_6$, $Si_3H_8$, TEOS, DCS, HCD and TSA, a purge gas, and a reaction gas comprising at least one of $O_2$, $N_2O$, $O_3$, $H_2O$ and $H_2O_2$ into the reaction space through a gas injector, wherein the silicon-containing gas, the purge gas, and the reaction gas are sequentially supplied onto the substrates, and the respective gases are continuously supplied by a gas injector having a plurality of injection parts adapted to rotate over the substrates without stop during the step of supplying the process gases, wherein the silicon-containing gas is supplied by a first injection part, the purge gas is supplied by second and fourth injection parts and the reaction gas is supplied by a third injection part, and wherein the reaction gas stays longer on the substrate than the silicon-containing gas due to a difference in distances between respective injection parts wherein the first to fourth injection parts are sequentially arranged in a clockwise direction, and wherein a first distance in a clockwise direction from the first injection part for supplying the silicon-containing gas to the second injection part, and a second distance in a counterclockwise direction from the first injection part to the fourth injection part are shorter than a third distance in a counterclockwise direction from the third injection part for supplying the reaction gas to the second injection part, and a fourth distance in a clockwise direction from the third injection part to the fourth injection part.

9. The method as claimed in claim 8, wherein the substrates are maintained to a temperature range of 100 to 400° C.

10. A method of forming an oxide film using an oxide film forming apparatus, which includes a chamber having a predetermined reaction space and a substrate mounting unit provided therein, and a gas injector rotatably provided above the substrate mounting unit in the chamber to inject a plurality of gases, the method comprising:

placing a plurality of substrates on the substrate mounting unit and rotating the gas injector;

supplying a silicon-containing gas comprising at least one of $SiH_4$, $Si_2H_6$, $Si_3H_8$, TEOS, DCS, HCD and TSA onto the substrates to adsorb the silicon-containing gas onto surfaces of the substrates;

injecting a purge gas onto the substrates to purge the silicon-containing gas that is not adsorbed onto the substrates;

supplying a reaction gas comprising at least one of $O_2$, $N_2O$, $O_3$, $H_2O$ and $H_2O_2$ onto the substrates to form an oxide film by oxidizing the silicon-containing gas adsorbed onto the surfaces of the substrates; and injecting a purge gas onto the substrates to purge the reaction gas that is not reacted with the silicon-containing gas, wherein the silicon-containing gas, the purge gas, and the reaction gas are supplied continuously and simultaneously, wherein the gas injector comprises a plurality of injection parts adapted to rotate over the substrates, wherein the silicon-containing gas is supplied by a first injection part, the purge gas is supplied by second and fourth injection parts and the reaction gas is supplied by a third injection part, and wherein the reaction gas stays longer on the substrate than the silicon-containing gas due to a difference in distances between respective injection parts, wherein the first to fourth injection parts are sequentially arranged in a clockwise direction, and wherein a first distance in a clockwise direction from the first injection part for supplying the silicon-containing gas to the second injection part, and a second distance in a counterclockwise direction from the first injection part to the fourth injection part are shorter than a third distance in a counterclockwise direction from the third injection part for supplying the reaction gas to the second injection part, and a fourth distance in a clockwise direction from the third injection part to the fourth injection part.

* * * * *